United States Patent
Kawano et al.

(10) Patent No.: US 7,526,358 B2
(45) Date of Patent: Apr. 28, 2009

(54) THREE-DIMENSIONAL CAD SYSTEM AND PART COST CALCULATION SYSTEM

(75) Inventors: Akio Kawano, Saitama (JP); Kazuhiro Iwai, Saitama (JP); Masakatsu Shimizu, Saitama (JP); Eiji Yamamoto, Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 1635 days.

(21) Appl. No.: 10/127,718

(22) Filed: Apr. 23, 2002

(65) Prior Publication Data

US 2002/0178027 A1 Nov. 28, 2002

(30) Foreign Application Priority Data

May 23, 2001 (JP) ............................. 2001-154507

(51) Int. Cl.
  *G06F 19/00* (2006.01)
  *G06F 3/00* (2006.01)
  *G06G 7/00* (2006.01)

(52) U.S. Cl. ........................... 700/182; 700/83; 700/98; 700/146; 700/165; 700/186; 700/197; 700/200; 715/700; 715/964; 705/400

(58) Field of Classification Search ................... 700/28, 700/29, 31, 36, 49, 83, 97–98, 118, 173, 700/180, 182, 197, 200, 204, 146, 186, 165; 715/700, 961, 964, 962; 703/6; 705/400
See application file for complete search history.

(56) References Cited

U.S. PATENT DOCUMENTS 5,552,995 A * 9/1996 Sebastian .................... 700/97
7,016,821 B2 * 3/2006 Rameau et al. ................ 703/2

FOREIGN PATENT DOCUMENTS

| EP | 0 789 310 A2 | 8/1997 |
|---|---|---|
| EP | 1 233 376 A2 | 8/2002 |
| EP | 1 233 377 A2 | 8/2002 |
| JP | 6-259518 A | 9/1994 |
| JP | 09160945 A | 6/1997 |
| JP | 10-296732 A | 11/1998 |

* cited by examiner

*Primary Examiner*—Sean P. Shechtman
(74) *Attorney, Agent, or Firm*—Birch, Stewart, Kolasch & Birch, LLP

(57) ABSTRACT

An object of the present invention is to provide a three-dimensional CAD-system for adding data about a drafting direction of a die to three-dimensional data about the part to be formed by that die, and a cost calculation system for calculating the cost of the part based on that drafting direction data. A three-dimensional model generation unit of a CAD system generates: a three-dimensional shaped model of a given part based on information coming from an input operation unit. A drafting direction data setting unit establishes drafting direction data when the input operation unit is operated to designate the drafting direction of the die for press molding, injection molding or the like of the part in question. A projected area calculation unit calculates a projected area S of the part on a plane perpendicular to the drafting direction of the applicable die on the basis of the three-dimensional model of that part and the drafting direction data involved. A depth calculation unit calculates a depth D of the part in the relevant drafting direction.

4 Claims, 7 Drawing Sheets

(VIEWED FROM A)

S 1 = x x . x x
D 1 = △△ . △△

(VIEWED FROM B)

S 1 = x x . x x
D 1 = △△ . △△

(VIEWED FROM C)

S 1 = x x . x x
D 1 = △△ . △△

US 7,526,358 B2

THREE-DIMENSIONAL CAD SYSTEM AND PART COST CALCULATION SYSTEM

CROSS-REFERENCE TO RELATED APPLICATIONS

The present application claims priority under 35 USC 119 to Japanese Patent Application No. 2001-154507 filed on May 23, 2001 the entire contents thereof is hereby incorporated by reference.

BACKGROUND OF THE INVENTION

1. Field of the Invention

The present invention relates to a three-dimensional CAD system and a parts cost calculation system for calculating production costs of parts to be formed by dies based on three-dimensional data about the parts in question. More particularly, the invention relates to a three-dimensional CAD system and a parts cost calculation system for calculating costs of parts in consideration of their drafting directions.

2. Description of Background Art

In recent years there has been a widespread use of systems for calculating costs of parts using computers. For example, Japanese Patent Laid-open No. Hei 9-160945 discloses a system that receives two-dimensional data about parts from a CAD system, extracts cost factors such as the size and shape of the parts from the received two-dimensional data, and calculates the cost of these parts based on the extracted cost factors.

The production costs of parts formed by dies are dependent not only on the size, weight, material and shapes of the parts but also on the cost of the dies to a considerable extent. The bulkier and heavier the dies, the higher their costs. That means the dies should preferably be designed to have the smallest possible volume.

To calculate the cost of a die requires obtaining both a projected area of the part in question on a plane perpendicular to a drafting direction of the die and a depth of the die in that drafting direction. Because conventional systems typically received two-dimensional data from an outside source as mentioned above, if the drafting direction is established anywhere other than with respect to the front, on the side or on top of the die, such a system has a difficulty in calculating the projected area of the part or the depth of the die involved.

Under the circumstances, whenever the drafting direction was set anywhere other than the above-mentioned three directions, the operator performing data input work upon cost calculation was required virtually to establish a drafting direction deemed optimal at his or her discretion and to predict accordingly a projected area of the part in question and a depth of the die involved in order to calculate die costs.

Such conventional procedures required not only many man-hours during data input work but also a high degree of expertise on the part of the operator. There was also a possibility that different drafting directions may be set for a given part by different operators. All this detracted from accurately calculating the cost of the parts.

SUMMARY AND OBJECTS OF THE INVENTION

The present invention has been made in view of the above circumstances and provides a three-dimensional CAD system for adding data about drafting directions to three-dimensional data about parts to be formed by dies, as well as a parts cost calculation system for calculating costs of the parts based on the drafting direction data.

In carrying out the invention and according to a first aspect thereof, there is provided a three-dimensional CAD system for generating three-dimensional data about a part to be formed by a die. The three-dimensional CAD system includes an operating element for designating a drafting direction and a drafting direction data setting element for setting data about the designated drafting direction based on the three-dimensional data about the part.

According to a second aspect of the present invention, there is provided a parts cost calculation system for calculating a production cost of a part to be formed by a die. The part cost calculation system includes a storing element for storing three-dimensional data about the part and a cost calculating element for calculating the cost of the part based on the three-dimensional data. The three-dimensional data includes a drafting direction data established therein. The cost calculating element calculates the cost of the part based on the three-dimensional data and on the drafting direction data.

The three-dimensional CAD system according to the first aspect of the present invention permits a setting of a desired drafting direction for a given die on the basis of a 3D shaped model of the part to be formed by that die. The inventive system may further calculate cost factors of the die based on drafting direction data associated therewith, the cost factors constituted by a projected area of the part involved on a plane perpendicular to the drafting direction and a depth of the die of interest in that drafting direction.

The parts cost calculation system according to the second aspect of the present invention may accurately calculate the cost of a given part based on the cost factors of the die involved with such as a projected area of the part on a plane perpendicular to the drafting direction of the die as well as a total length of the part in that drafting direction.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
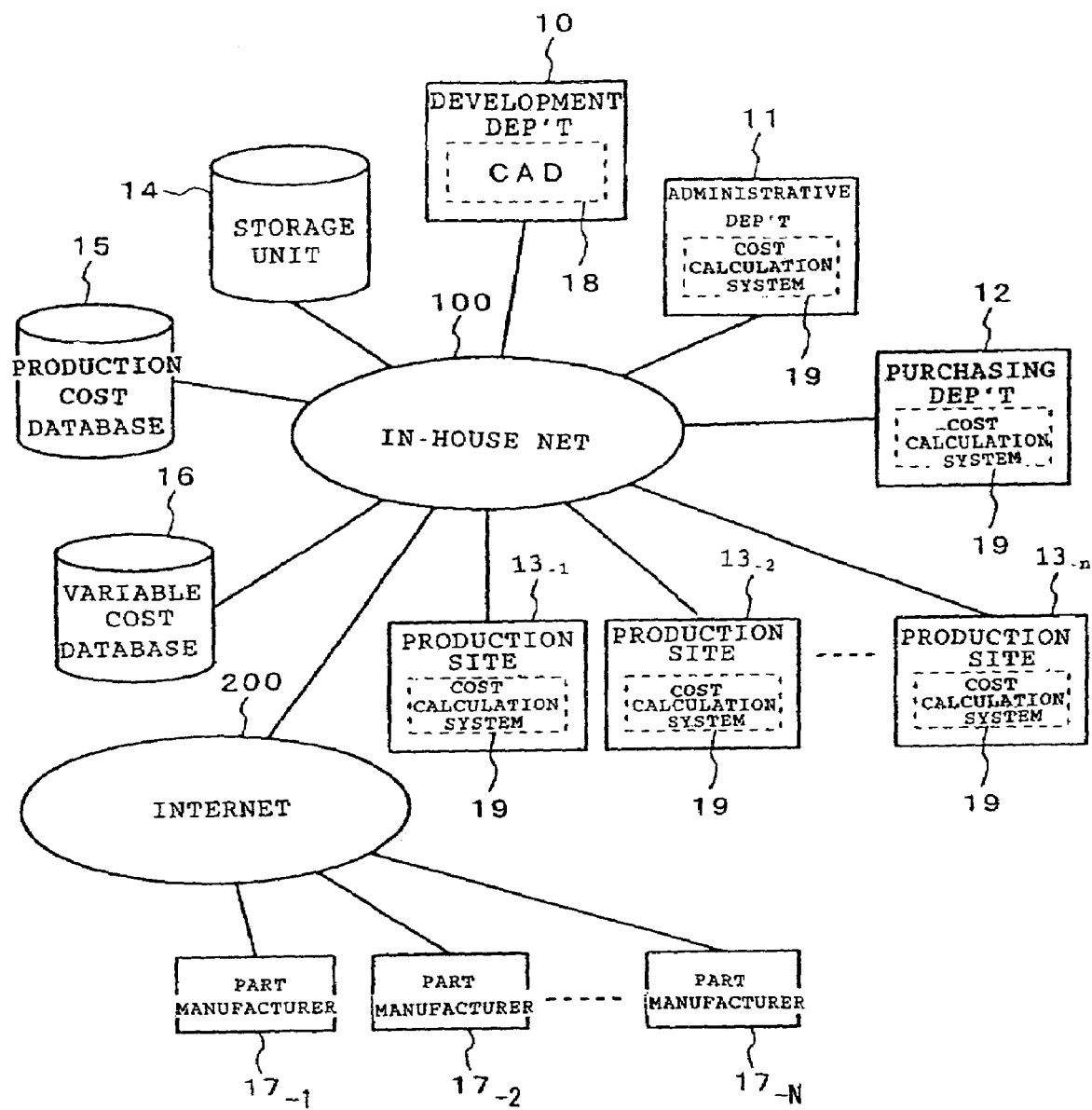
FIG. 1 is a network diagram showing a three-dimensional CAD system and a parts cost calculation system according to the present invention.

Preferred embodiments of the present invention will now be described by referring to the accompanying drawings. FIG. 1 is a network diagram showing a three-dimensional CAD system and a parts cost calculation system according to the present invention.

In the setup of FIG. 1, a Development Department 10 includes a three-dimensional CAD system 18. An Administrative Department 11, a Purchasing Department 12 and production sites 13-1, 13-2, . . . , 13-n (generically called the In-house Production Department 13 as a group hereunder) are each equipped with an information processing terminal such as a personal computer acting as a cost calculation system 19. These information processing terminals are connected to a network such as a LAN, an intranet or an extranet (called the in-house net hereunder) 100.

The in-house net 100 is also connected with storage units 14, 15 and 16 for accommodating data. The storage unit 14 stores shape data and other relevant data about parts to be estimated for cost, the data being supplied from the CAD system 18 in the Development Department 10. The storage unit 15 (also called the production cost database 15 hereunder) retains production costs as a fixed part of the cost factors determining the price of each product. The storage unit 16 (also called the variable cost database 16 hereunder) holds variable cost factors including throughput, production methods, and wage rates (labor costs per hour). The storage unit 14, production cost database 15 and variable cost database 16 may be implemented as shared database functions by use of known groupware.

The in-house net 100 may be connected to the Internet 200 which in turn may be connected with information processing terminals of part manufacturers 17-1, 17-2, . . . , 17-N (generically called the part manufacturers 17 as a group hereunder). The information processing terminals of the part manufacturers 17 may each act as a parts cost estimation device of the present invention. The part manufacturers 17 may be constituted by vendors in different fields of specialties such as foundries, forging works and machining shops or may consist of vendors in the same field of specialty.

Alternatively, the production cost database 15 and variable cost database 16 may be connected not to the in-house net 100 but to the Internet 200. As another alternative, the part manufacturers 17 may be included in the in-house net 100.

Figure 2:
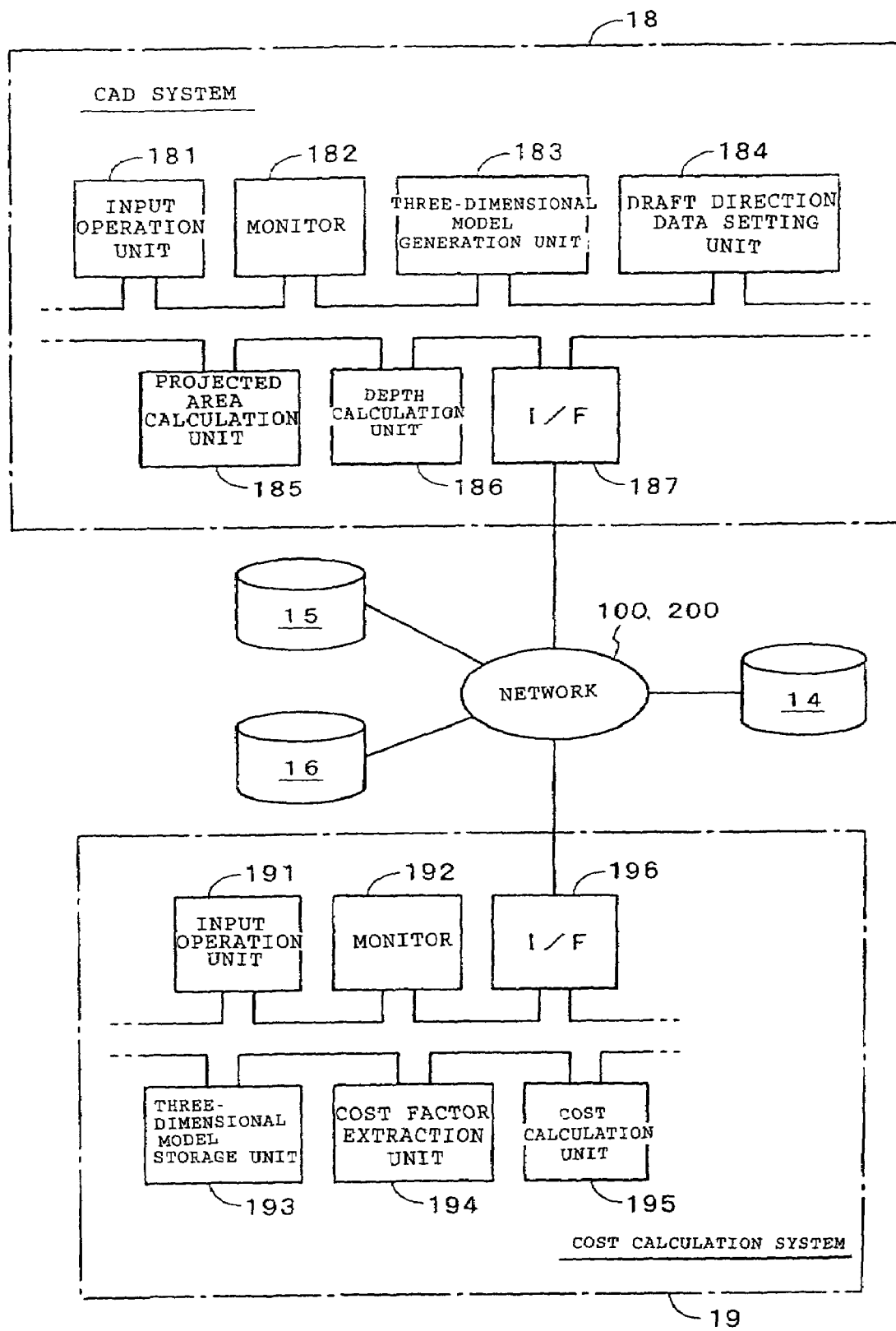
FIG. 2 is a block diagram depicting major components of the first embodiment of the present invention embracing the CAD system and cost calculation system.

FIG. 2 is a block diagram depicting major components of a first embodiment of the present invention embracing the above-described CAD system 18 and cost calculation system 19.

In the CAD system 18, an input operation unit 181 is a pointing device such as a keyboard and a mouse. The input operation unit 181 is used to input diverse items of information for determining the shape of a given part to be estimated and for designating the drafting direction of the die by which to form the part in question. A monitor 182 is a CRT or a liquid crystal display, displaying echoes of data input through the input operation unit 181 as well as the results of processing.

A three-dimensional model generation unit 183 generates a three-dimensional shaped model of a given part based on various items of information fed from the input operation unit 181. A drafting direction data setting unit 184 generates and establishes drafting direction data when the input operation unit 181 is operated to designate the drafting direction of the die for press molding or injection molding of the part in question, as will be described later in more detail.

A projected area calculation unit 185 calculates as a cost factor a projected area S of the part of interest on a plane perpendicular to the drafting direction of the applicable die on the basis of a three-dimensional model of the part and the drafting direction data involved. A depth calculation unit 186 calculates as another cost fact a depth D of the die based on the total length of the part in the drafting direction involved. The three-dimensional shaped model, drafting direction data, projected area S and die depth D are stored into the storage 14 through an interface 187.

In the cost calculation system 19, an input operation unit 191 is a pointing device such as a keyboard and a mouse. A monitor 192 displays echoes of data input by the input operation unit 191 as well as results of processing. To a three-dimensional model storage unit 193, the three-dimensional shaped models, drafting direction data, projected areas S, and depths D of parts to be estimated are transferred for storage through an interface 196 in response to an operator's request.

A cost factor extraction unit 194 extracts cost factors of a given part based on the relevant three-dimensional shaped model held in the three-dimensional model storage unit 193. A cost calculation unit 195 calculates the cost of the applicable die using the projected area S and depth D as cost factors, and computes the cost of the part in question based on the calculated die cost as well as on the cost factors of that part.

Cost calculation processes of the first embodiment are described below using an example of how to calculate the cost of an L-shaped plate 1 shown in FIG. 3. It is assumed here that a three-dimensional shaped model of the L-shaped plate 1 has already been generated by the CAD system 18 and that supplementary data about the material and finish of the part in question are already stored in the storage units 15 and 16.

An operator at the CAD system 18 first operates the input operation unit 181 (i.e., pointing device) to vary the three-dimensional shaped model of the L-shaped plate 1 in attitude on the monitor 182. In response, the monitor 182 shows the projected area S and depth D of the L-shaped plate 1 in effect with the drafting direction perpendicular to, say, the monitor screen.

Figure 3:
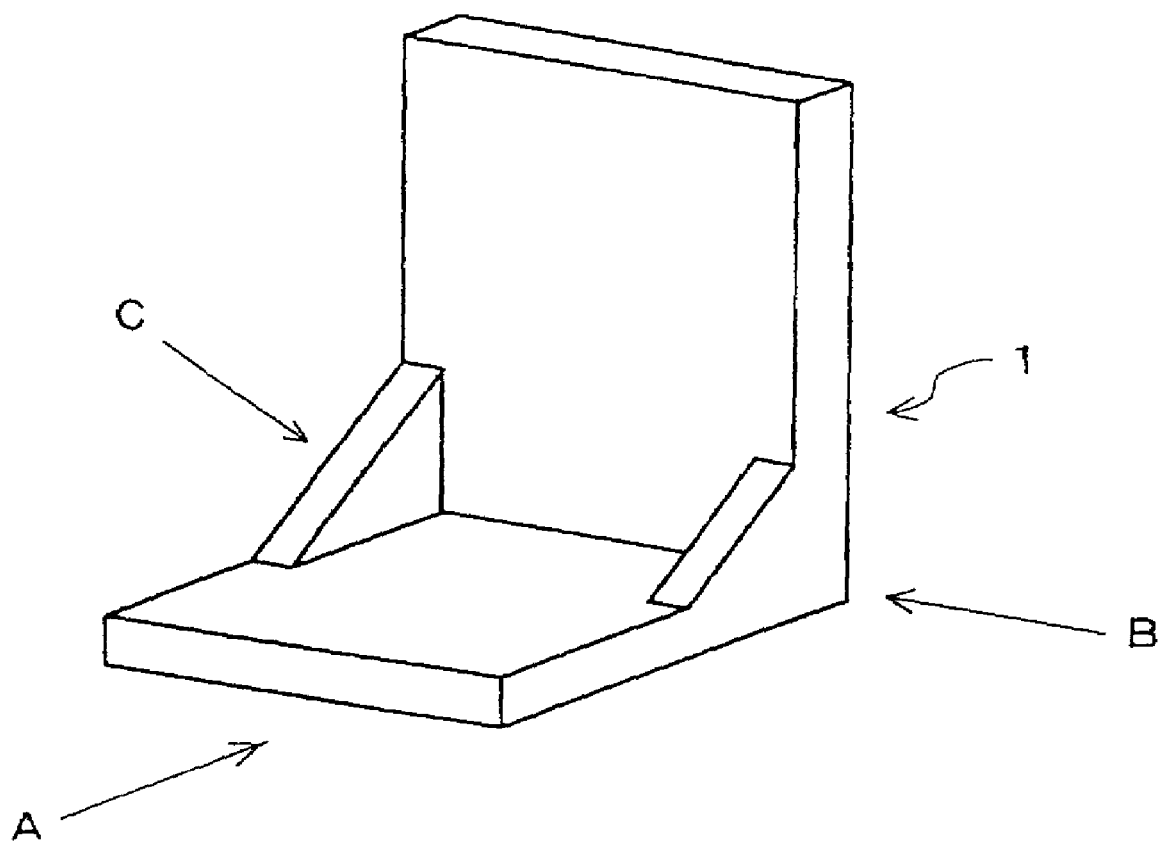
FIG. 3 is a perspective view of an L-shaped plate as a typical part to be estimated.
Figure 4A:
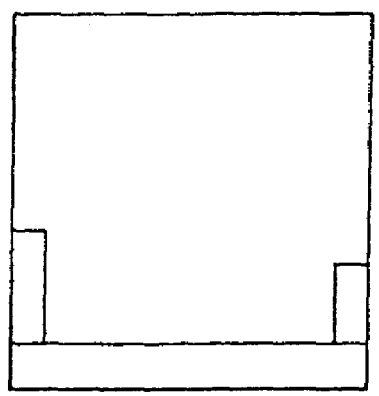
FIGS. 4(a), 4(b) and 4(c) are schematic views of a three-dimensional shape model of the part as displayed by the CAD system.

FIG. 4(a) is a schematic view of the L-shaped plate 1 whose three-dimensional shaped model is varied in attitude on the CAD system 18 so as to be viewed in the direction of arrow A as indicated in FIG. 3.

Figure 5A:
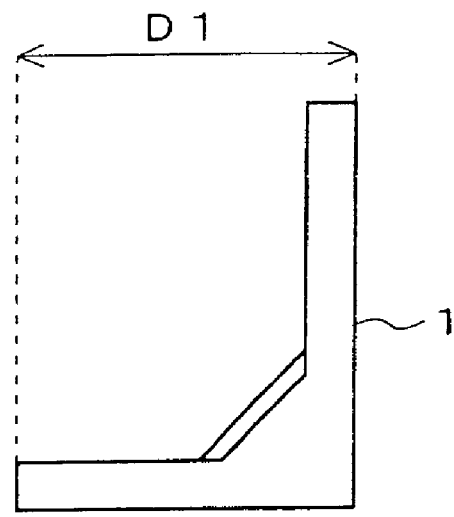
FIGS. 5(a), 5(b) and 5(c) are schematic views illustrating how depths D are calculated.
Figure 6A:
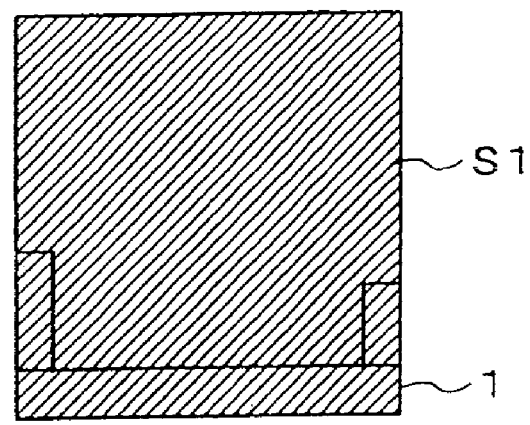
FIGS. 6(a), 6(b) and 6(c) are schematic views indicating how projected areas S are calculated.

In that case, as shown in FIG. 5(a), the depth calculation unit 186 calculates a die depth D1 in the drafting direction based on the relevant three-dimensional shaped model data. The projected area calculation unit 185 computes a projected area S1 of the L-shaped plate 1 on a plane perpendicular to the drafting direction, as illustrated in FIG. 6(a). The calculated results S1 and D1 are indicated on the monitor 182 of the CAD system 18 along with the three-dimensional shape model in question as depicted in FIG. 4(a).

Figure 4B:
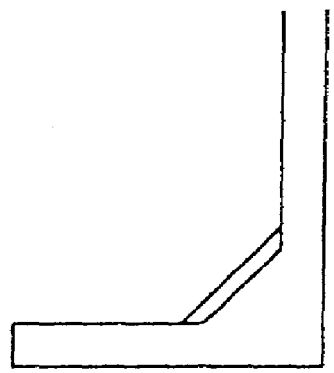
Figure 5B:
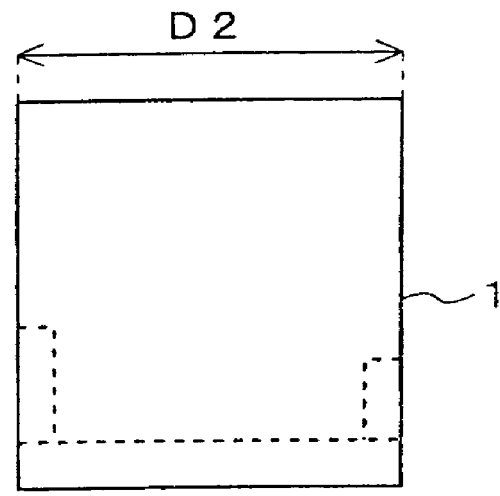
Figure 6B:
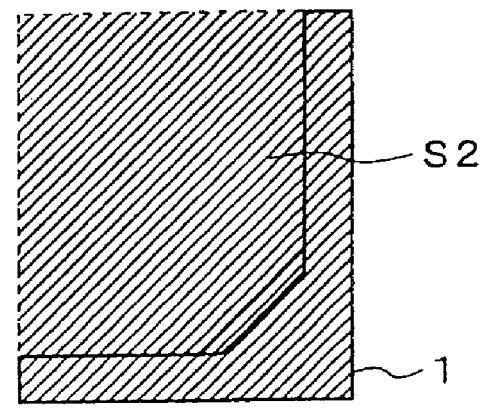

When the three-dimensional shape model is varied in attitude to provide the image in an arrowed direction B indicated in FIG. 3, the monitor 182 displays what is shown in FIG. 4(b). The depth calculation unit 186 computes a depth D2 of the die in the drafting direction, as depicted in FIG. 5(b). The projected area calculation unit 185 calculates a projected area S2 of the L-shaped plate 1 on a plane perpendicular to the drafting direction as shown in FIG. 6(b). The computed results S2 and D2 are indicated on the monitor 182 along with the three-dimensional shape model in question as depicted in FIG. 4(b) .

Figure 4C:
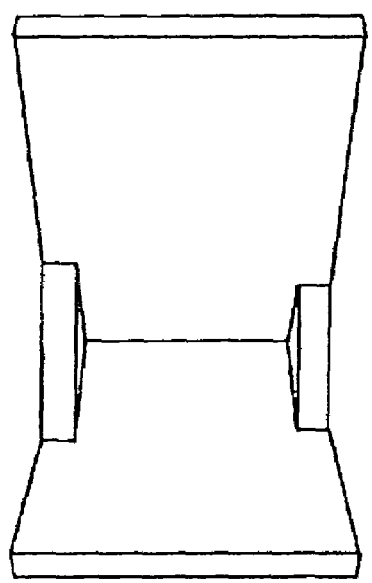
Figure 5C:
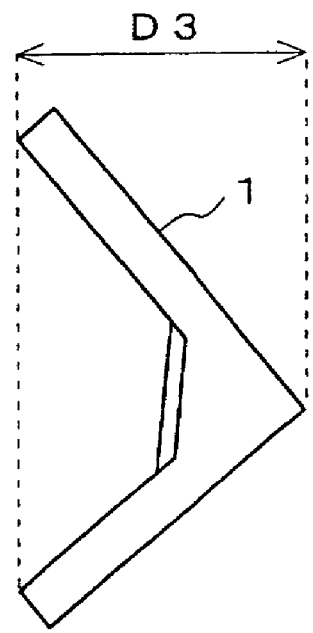
Figure 6C:
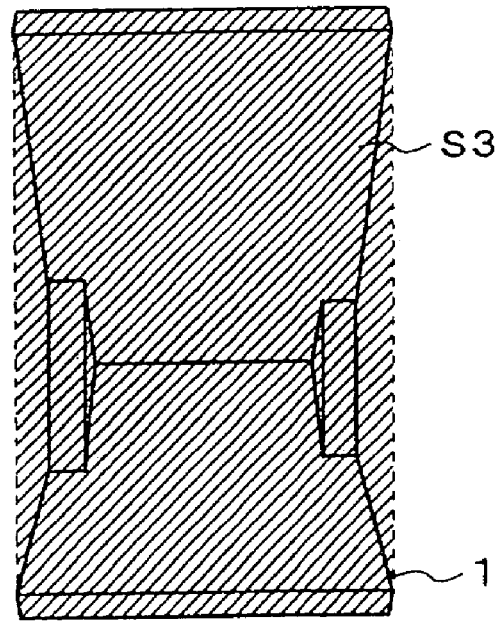

Likewise, when the three-dimensional shape model is varied in attitude to provide the image in an arrowed direction C indicated in FIG. 3, the monitor 182 displays what is shown in FIG. 4(c). The depth calculation unit 186 computes a depth D3 of the die in the drafting direction, as depicted in FIG. 5(c). The projected area calculation unit 185 calculates a projected area S3 of the L-shaped plate 1 on a plane perpendicular to the drafting direction as shown in FIG. 6(c). The computed results S3 and D3 are indicated on the monitor 182 along with the three-dimensional shaped model in question as depicted in FIG. 4(c).

Watching the depth D and projected area S on the monitor 182, the operator at the CAD system 18 varies the three-dimensional shaped model in attitude on display to determine a desired drafting direction and sets the drafting direction data to the drafting direction data setting unit 184.

The three-dimensional shape model thus obtained about each part, drafting direction data about the die involved, and the projected area S and depth D in the relevant drafting direction are identified for each part before being stored into the storage unit 14.

As described, the three-dimensional CAD system according to the present invention permits the establishment of a desired drafting direction of a given die based on a three-dimensional shaped model of the part to be shaped by the die in question. The inventive CAD system further acquires the projected area of the part on a plane perpendicular to the drafting direction of the applicable die and the depth of that die and provides the results as cost factors of the die in question.

How the cost calculation system 19 works will now be described. The operator at the cost calculation system 19 first operates the input operation unit 191 to retrieve from the storage unit 14 a number of data items including the three-dimensional shaped model of the part to be estimated as well as the depth D and projected area S of the part, and stores the retrieved data into the three-dimensional shape model storage unit 193.

The cost factor extraction unit 194 extracts cost factors of the part in question based on the three-dimensional shape model held in the storage unit 193, retrieving at the same time the depth D and projected area S from the storage unit 193. Based on the cost factors thus obtained, the cost calculation unit 195 calculates the cost of the part of interest.

As described, the cost calculation system according to the present invention calculates the cost of a given part based on the cost factors of the die involved such as the projected area of the part on a plane perpendicular to the drafting direction and the total length of the part in the drafting direction. The inventive system thus provides more accurate cost estimation than before.

Figure 7:
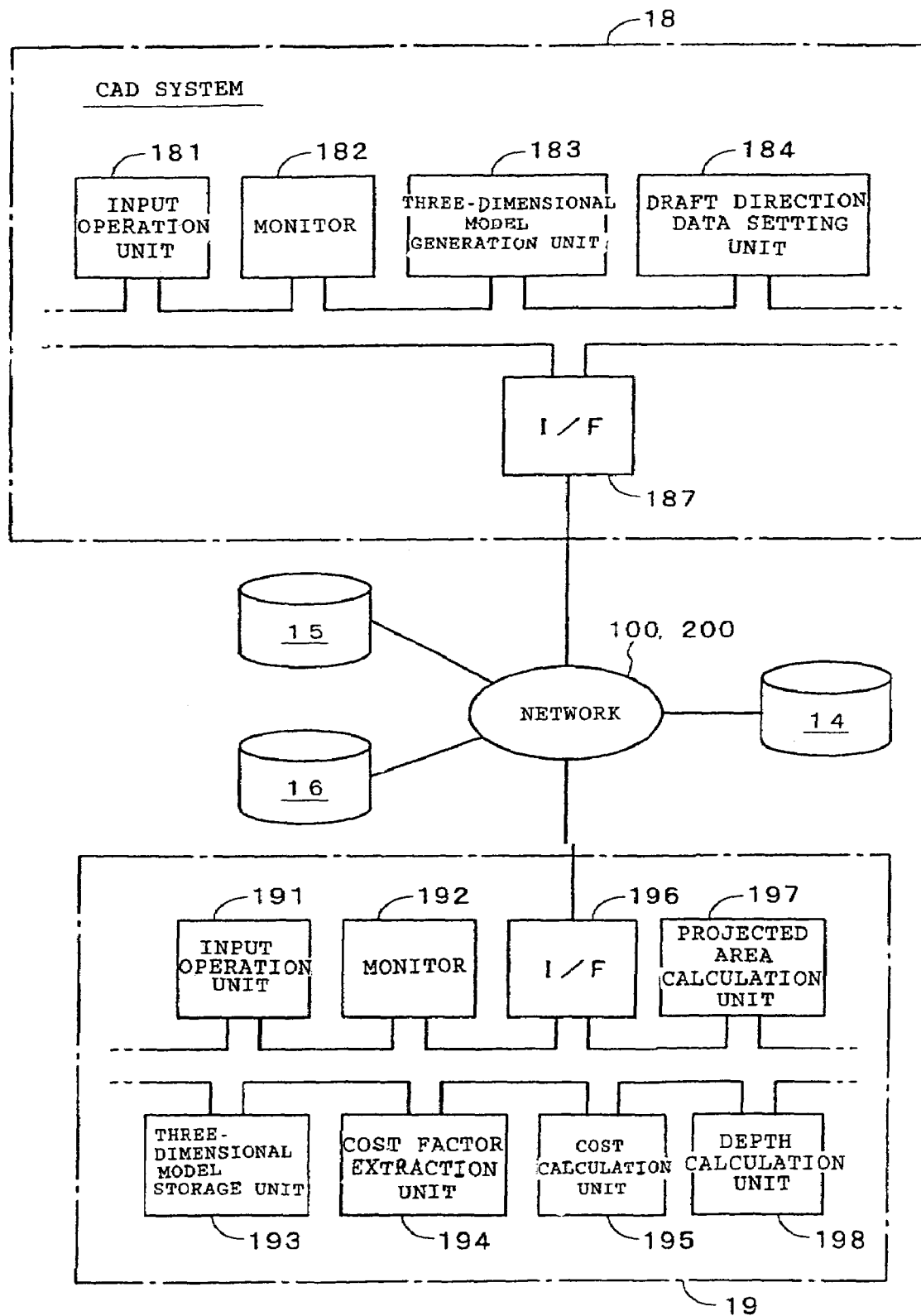
FIG. 7 is a block diagram showing major components of the second embodiment of the present invention embracing the CAD system and cost calculation system.

FIG. 7 is a block diagram showing major components of a second embodiment of the present invention embracing the above-described CAD system 18 and cost calculation system 19. Of the reference numerals in FIG. 7, those already used in the first embodiment designate like or corresponding parts.

The first embodiment above was described as having the projected area calculation unit 185 and depth calculation unit 186 contained in the CAD system 18. In the second embodiment, by contrast, a projected area calculation unit 197 and a depth calculation unit 198 corresponding to the two units are included in the cost calculation system 19.

In that structure, the CAD system 18 sets only drafting directions and stores the drafting direction data into the storage unit 14 together with relevant three-dimensional shape models. In the cost calculation system 19, the projected area calculation unit 197 calculates the projected area S and the depth calculation unit 198 computes the depth D in the same manner as described above in conjunction with the first embodiment.

The second embodiment of the present invention includes a minimal structure added anew to the CAD system 18. This makes it possible for the second embodiment to provide substantially the same effects as the first embodiment by making only a few improvements to a conventional CAD system.

The present invention when illustratively embodied as described above offers the following major benefits:

The CAD system of the present invention permits a setting of a desired drafting direction of a given die based on a three-dimensional shaped model of the part to be formed by that die. The inventive CAD system further acquires the projected area of the part on a plane perpendicular to the drafting direction of the applicable die and the depth of that die and provides the results as cost factors of the die in question.

The parts cost calculation system of the present invention accurately calculates the cost of a given part based on the cost factors of the die involved such as the projected area of the part on a plane perpendicular to the drafting direction of the die and the total length of the part in the drafting direction.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A computer aided design (CAD) system for generating three-dimensional data about a part to be formed by a die by press molding or injection molding, said three-dimensional CAD system comprising:
  an input device configured to input information about the part;
  a three-dimensional model generation unit configured to generate a three-dimensional model of the part based on the information input via the input device;
  a display controlled to display the three-dimensional model and to sequentially rotate the displayed three-dimensional model in a first, second and third orthogonal direction to show a corresponding first, second and third orthogonal view of the model;
  a drafting direction data setting unit configured to generate designated drafting direction data for each of the first, second and third orthogonal views; and
  a calculator configured to calculate cost factors of said die based on the drafting direction data of the die.

2. The CAD system according to claim 1, wherein the designated drafting direction data for each of the first, second and third orthogonal views comprise:
  a projected area of said part on a plane perpendicular to a drafting direction of each of the first, second and third orthogonal views; and
  a depth of said die in said drafting direction of each of the first, second and third orthogonal views.

3. A computer aided design (CAD) method for generating three-dimensional data about a part to be formed by a die by press molding or injection molding, said method comprising:
  inputting information about the part;
  generating a three-dimensional model of the part based on the input information;
  displaying the three-dimensional model on a display;
  sequentially rotating the displayed three-dimensional model on the display in a first, second and third orthogonal direction to show a corresponding first, second and third orthogonal view of the model;

generating designated drafting direction data of the die for each of the first, second and third orthogonal views; and calculating cost factors of said die based on the drafting direction data of the die.

4. The method according to claim 3, wherein the designated drafting direction data for each of the first, second and third orthogonal views comprise:

a projected area of said part on a plane perpendicular to a drafting direction of each of the first, second and third orthogonal views; and a depth of said die in said drafting direction of each of the first, second and third orthogonal views.

* * * * *